(12) United States Patent
Fomenko et al.

(10) Patent No.: US 9,899,826 B2
(45) Date of Patent: Feb. 20, 2018

(54) DEVICE FOR DETECTING OVERCURRENT

(71) Applicant: PHOENIX CONTACT GMBH & CO. KG, Blomberg (DE)

(72) Inventors: Alexander Fomenko, Bielefeld (DE); Guido Nahles, Bad Lippspringe (DE); Gerhard Woelk, Schieder-Schwalenberg (DE)

(73) Assignee: PHOENIX CONTACT GMBH & CO. KG (DE)

( * ) Notice: Subject to any disclaimer, the term of this patent is extended or adjusted under 35 U.S.C. 154(b) by 0 days.

(21) Appl. No.: 15/359,119

(22) Filed: Nov. 22, 2016

(65) Prior Publication Data
US 2017/0149234 A1   May 25, 2017

(30) Foreign Application Priority Data
Nov. 25, 2015 (DE) ......................... 10 2015 223 358

(51) Int. Cl.
*H02H 3/093* (2006.01)
*G01R 19/165* (2006.01)
(Continued)

(52) U.S. Cl.
CPC ............ *H02H 3/093* (2013.01); *G01R 19/00* (2013.01); *G01R 19/16571* (2013.01);
(Continued)

(58) Field of Classification Search
CPC ............ H02H 3/021; H02H 3/05; H02H 3/06; H02H 3/093; H02H 3/0935; G01R 19/00; G01R 19/16571
(Continued)

(56) References Cited

U.S. PATENT DOCUMENTS 5,627,717 A   5/1997   Keine
5,994,790 A   11/1999  Nagashima et al.
(Continued)

FOREIGN PATENT DOCUMENTS

DE   10 2005 046 980 A1   4/2007
DE   10 2008 026 737 A1   4/2009
(Continued)

OTHER PUBLICATIONS

Search Report prepared by the European Patent Office dated Apr. 24, 2017, for European Patent Application No. EP 3 176 892 A1.
(Continued)

*Primary Examiner* — Thienvu Tran
*Assistant Examiner* — Kevin J Comber
(74) *Attorney, Agent, or Firm* — Sheridan Ross P.C.

(57) ABSTRACT

The object of the invention is a device for detecting an overcurrent, having a current meter, a first counter, and a switch, wherein the current meter measures a current through the device, with the switch being capable of interrupting a current flow through the device, wherein, if the current meter measures a current that exceeds a first current threshold, the first counter is changed by a first increment in a first direction, wherein, if the current meter measures a current that exceeds a second current threshold, the first counter is changed by a second increment in the first direction, with the second current threshold being quantitatively greater than the first current threshold, and with the second increment being quantitatively greater than the first increment, wherein, after a change in the counter, the first counter is compared with a first counter threshold, and if the counter threshold has been reached or exceeded, the switch is actuated continuously such that the current flow is interrupted, and otherwise the switch is actuated for a predetermined time such that the current flow is interrupted.

8 Claims, 3 Drawing Sheets

(51) Int. Cl.
   *H02H 3/02* (2006.01)
   *H02H 3/05* (2006.01)
   *G01R 19/00* (2006.01)
   *H02H 3/06* (2006.01)

(52) U.S. Cl.
   CPC .............. *H02H 3/021* (2013.01); *H02H 3/05* (2013.01); *H02H 3/06* (2013.01); *H02H 3/0935* (2013.01)

(58) Field of Classification Search
   USPC .......................................................... 361/87
   See application file for complete search history.

(56) References Cited

U.S. PATENT DOCUMENTS

2010/0328828 A1  12/2010  Xu
2014/0347774 A1  11/2014  Uehara

FOREIGN PATENT DOCUMENTS

DE  10 2012 103 551 A1  10/2013
DE  10 2015 104 568 A1  10/2015

OTHER PUBLICATIONS

German Search Report prepared by the German Patent Office dated Apr. 26, 2016, for German Patent Application No. 10 2015 223 358.8.

DEVICE FOR DETECTING OVERCURRENT

This application claims the benefit of German Patent Application No. 10 2015 223 358.8 filed Nov. 25, 2015, the entire contents of which are incorporated herein by reference.

Numerous devices for detecting overcurrent are known from the prior art.

One difficulty that arises in this context is distinguishing true short circuits from virtual short circuits. Virtual short circuits arise as a result of capacitive loads, which behave like a short circuit, particularly at switch-on. That is, until the capacitive load is appropriately charged, substantial current can be flowing.

It is for this reason that it has been attempted time after time in the past to identify these virtual short circuits.

For example, an electronic protection device is known from DE 10 2012 103 551 A1 that switches off a controllable switch in accordance with an overcurrent and switches it back on again in accordance with the change in voltage at the output.

A drawback of these devices is that they first operate and switch off on the assumption of an overcurrent, and only enable a connection after a certain time depending on a reclose condition. As a result, an unnecessarily long time is often required in order to charge a capacitive load. In addition, identification is relatively complicated, since the storage of "historical" values is required. Moreover, it is often problematic in such arrangements that, upon opening of the switch, the capacitive load is discharged through a parallel resistive load, so that a capacitive (partial) load can nonetheless be identified incorrectly as a short circuit in some circumstances. In particular, the device claimed therein proves problematic when it comes to switching on a capacitive load, since the switch-off condition is already met at switch-on, so no historical voltage value is available for comparison.

It is the object of the invention to provide improved and cost-effective devices for detecting a short circuit that avoid one or more of the drawbacks of the prior art.

The object is achieved according to the invention by the features of the independent claims. Advantageous embodiments of the invention are indicated in the subclaims.

In the following, the invention is explained in further detail with reference to the attached drawing on the basis of preferred embodiments.

The invention is explained in further detail below with reference to the figure. It should be noted that different aspects are described, each of which can be utilized individually or in combination. That is, any aspect can be used with different embodiments of the invention, provided that it is not portrayed explicitly as a mere alternative.

Moreover, for the sake of simplicity, reference will generally be made in the following to only one entity. Insofar as not noted explicitly, however, the invention can also have several of the entities concerned. Therefore, the use of the words "a," "an," "of a" and "of an" is to be understood only as an indication to the effect that at least one entity is used in a single embodiment.

Figure 1:
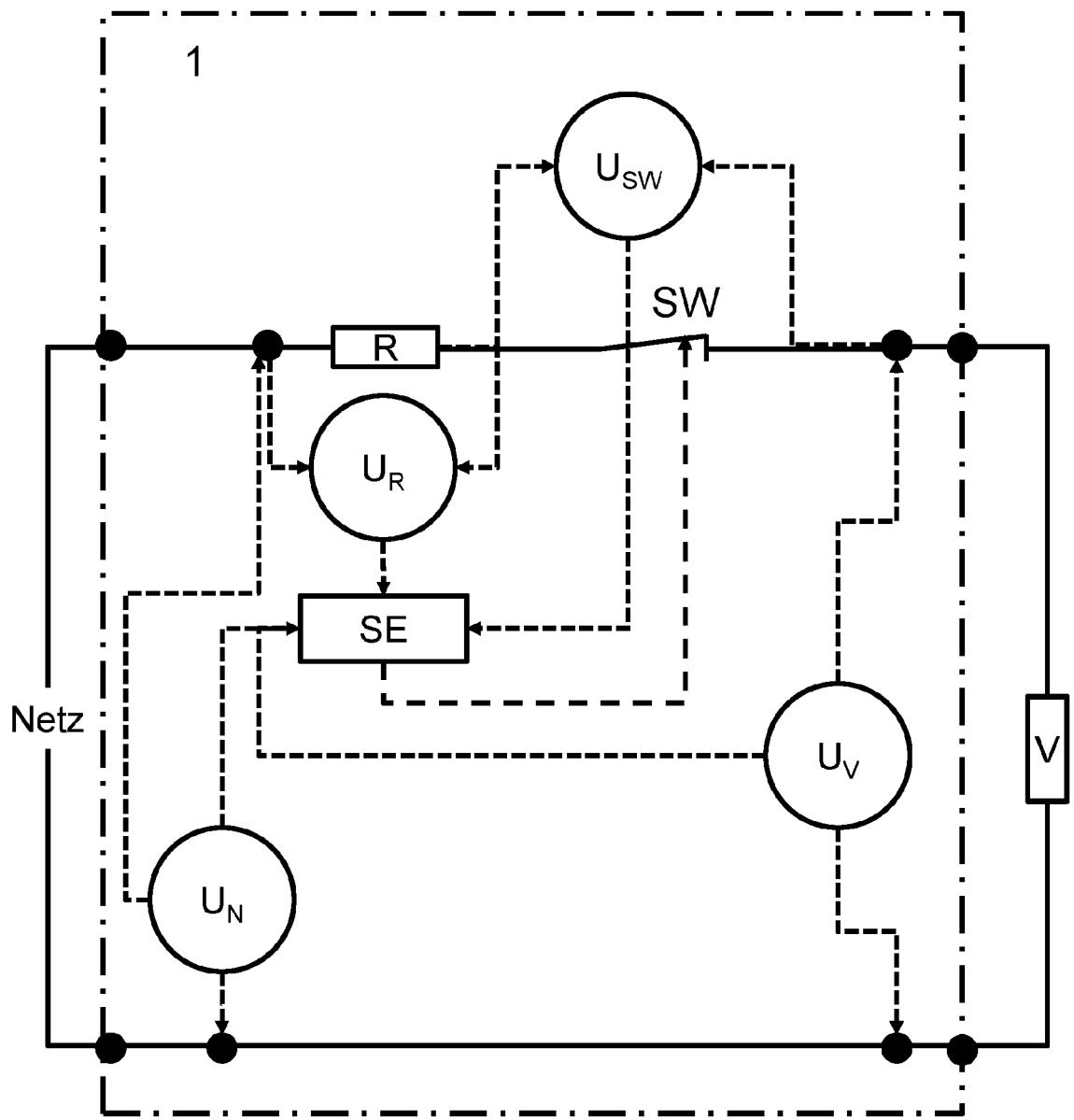
FIG. 1 shows an overview of embodiments according to the invention.

In one embodiment of the invention, which is contained in FIG. 1 for the sake of example, a device 1 for detecting an overcurrent has a current meter $U_R$, a first counter $Z_I$, and a switch SW. To provide a better overview, the device 1 is surrounded in the illustration by a dotdashed frame.

The current meter $U_R$ measures a current I through the device 1. Any type of current measurement is possible for this purpose in principle, whether through an induced magnetic field (e.g., Rogowski coil, Hall sensor) or through current measurement using a shunt resistor R or the like.

The switch SW is capable of interrupting a current flow through the device 1. In principle, any type of switch can be used here, for example a mechanical switch or an electrical switch, such as a controlled (field-effect) transistor.

If the current meter $U_R$ measures a current I that exceeds a first current threshold $I_{ref,1}$, i.e., $I > I_{ref,1}$, the first counter $Z_I$ is changed by a first increment $INC_1$ in a first direction. In the present example, it is assumed that the first increment is 1 and the direction corresponds to an addition "+," for example. Furthermore, it is assumed that the first current threshold $I_{ref,1}$ corresponds, for example, to 1.1 times the rated current value for which the device 1 is designed.

However, it is readily apparent to a person skilled in the art that other equivalent implementations can also be selected in which the direction corresponds to a subtraction, for example.

If the current meter $U_R$ measures a current I that exceeds a first current threshold $I_{ref,1}$, the first counter $Z_I$ is changed by a first increment $INC_2$ in the first direction +. The second threshold $I_{ref,2}$ is quantitatively greater than the first threshold $I_{ref,1}$, and the second increment $INC_2$ is quantitatively greater than the first increment $INC_1$. In the present example, it is assumed that the first increment is 1 and the direction corresponds to an addition "+," for example. In the example, it is assumed that the second increment is 5, for example. Furthermore, it is assumed that the second current threshold $I_{ref,2}$ corresponds, for example, to 1.5 times the rated current value for which the device 1 is designed.

After a change in the counter, the first counter $Z_I$ is compared with a counter threshold $Z_{ref}$, and if the counter threshold $Z_{ref}$ has been reached or exceeded, the switch SW is actuated continuously such that the current flow is interrupted. Otherwise, the switch SW is actuated for a predetermined time $t_{off}$ such that the current flow is interrupted.

In other words, a switch-off condition is created whereby the normal case is the current flow. A continuous switch-off is initiated only in the event that a short circuit is identified with certainty. In all other cases of overcurrent, there is only a short-term interruption.

The control can be an active actuation ("open") or passive inaction ("do not close") and depends on the type of switch SW. That is, the switch SW can be designed both as an opener and as a closer.

In another advantageous embodiment of the invention, if the current meter $U_R$, subsequently to a temporary interruption, measures a current I that does not exceed the first current threshold $I_{ref,1}$, the first counter $Z_I$ is changed by a third increment $INC_3$ in a second direction, with the second direction being different from the first direction. In the present example, it is assumed that the third increment is also 1 and the direction corresponds to a subtraction "−," for example.

In another advantageous embodiment of the invention, the device 1 further comprises a setting means for the counter that sets the first counter $Z_I$ to a predetermined counter value at the beginning of operation. For example, the first counter $Z_I$ can be set to 0.

Figure 2:
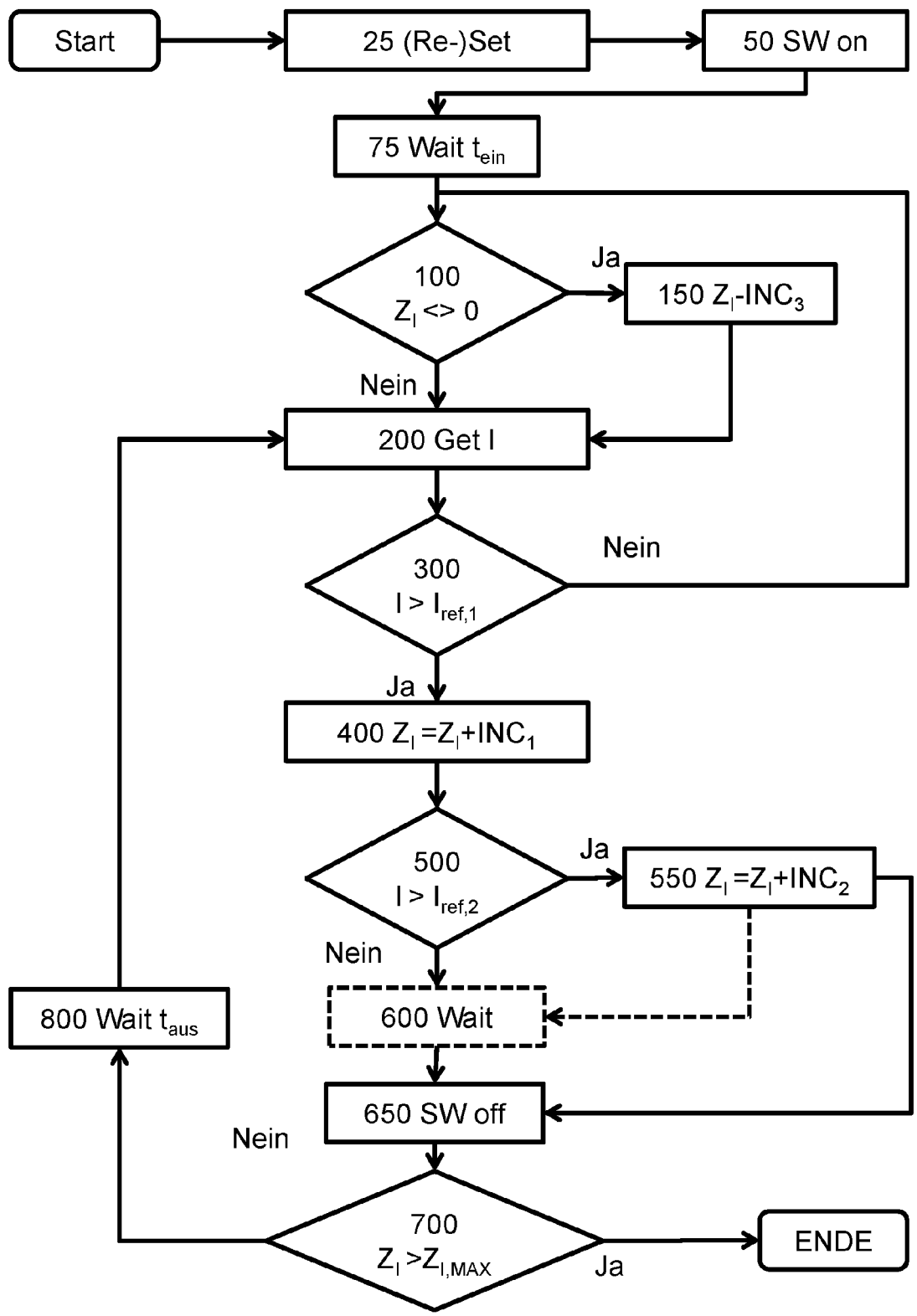
FIG. 2 shows a flowchart of a first embodiment of the invention.

A corresponding method such as that shown in FIG. 2, for example, can then be implemented.

In a first step 25, the first counter is set to the predetermined (initial) value.

Then, in step 50, the switch SW is actuated such that current flows to the load V. After passing of a predetermined time $t_{on}$ (step 75), it is checked in step 100 whether the first counter is unequal to the predetermined (initial) value. It is being assumed here that the predetermined (initial) value is 0.

If the counter is unequal to the predetermined (initial) value, then the first counter $Z_I$ is decremented by the third increment $INC_3$—initially by 1, in the example.

Subsequently, or when the first counter corresponds to the predetermined (initial) value, the current I is measured in step 200.

The measured current I is compared in step 300 with the first current threshold $I_{ref,1}$. In the example, it is assumed that the first current threshold corresponds, for example, to 1.1 times the nominal current through the device.

If the measured current I is less than the first current threshold $I_{ref,1}$, the process returns to step 100.

If the measured current I is greater than the first current threshold $I_{ref,1}$, the first counter $Z_I$ is incremented in step 400 by the first increment $INC_1$—initially by 1, in the example.

The measured current I is compared in step 500 with the second current threshold $I_{ref,2}$.

If the measured current I is greater than the second current threshold $I_{ref,2}$, the first counter $Z_I$ is incremented in step 550 by the second increment $INC_2$—initially by 5, in the example.

Subsequently, or when the measured current I is less than the second current threshold $I_{ref,2}$, a predetermined time is waited in step 600 (optional), or the switch SW is immediately actuated in step 650 such that it opens.

It can now be checked in step 700 whether the first counter has reached a certain first counter threshold $Z_{I,MAX}$. In the present case, this value could be 40, for example.

Once the value is reached, the switch is not switched on again and the process ends.

On the other hand, if the first counter threshold $Z_{I,MAX}$ is not reached, a predetermined time $t_{off}$ is waited in step 800, and then the process proceeds to step 200.

It will readily be understood that the conditions of the overshooting can also be equivalently replaced by other conditions.

Figure 3:
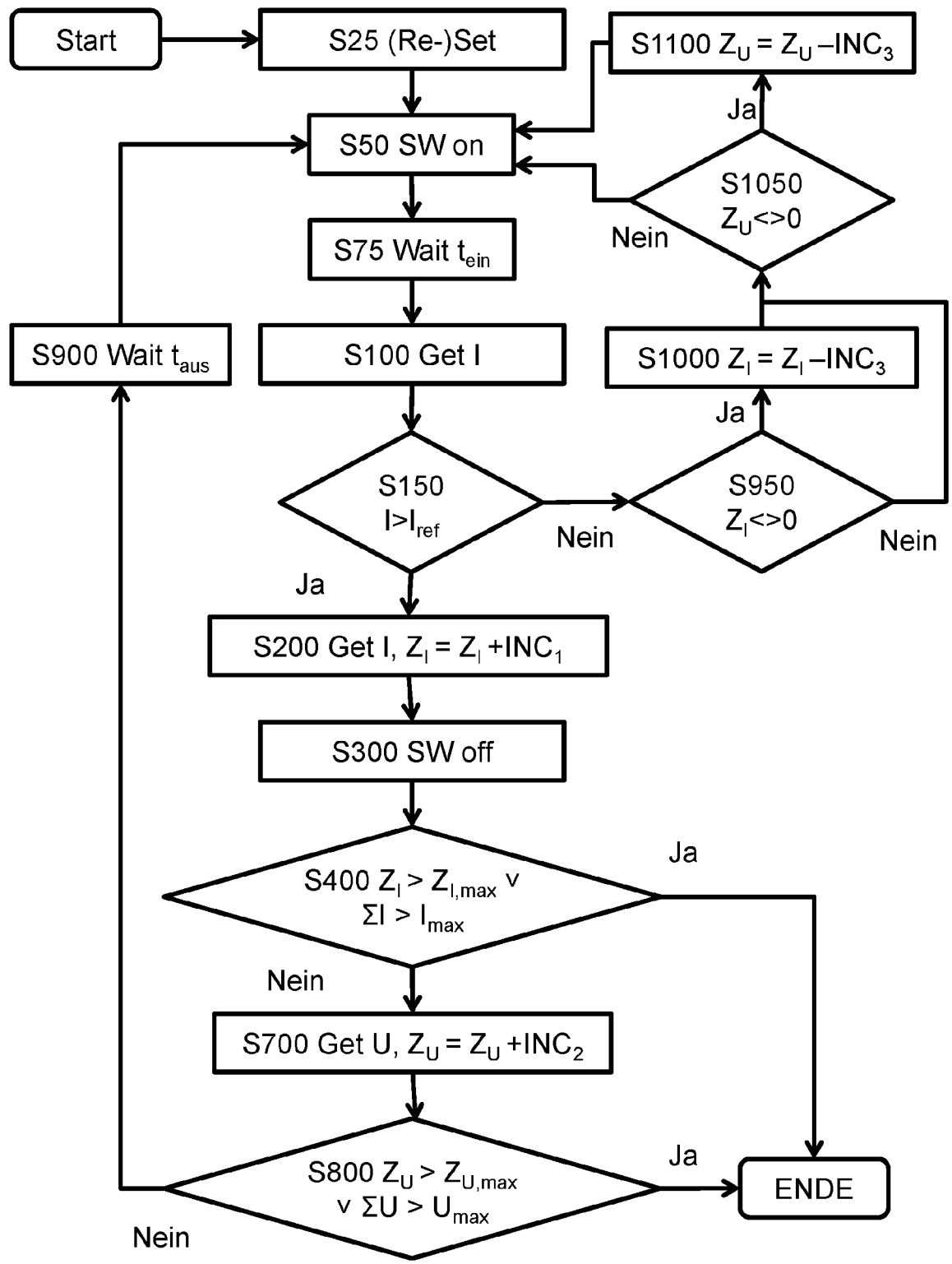
FIG. 3 shows a flowchart of a second embodiment of the invention.

In another embodiment of the invention, the device 1 again has a current meter $U_R$, a first counter $Z_I$, a second counter $Z_U$, a voltmeter $U_{SW}$, and a switch SW. The associated method will be explained with reference to FIG. 3.

The current meter $U_R$ measures a current I through the device 1. Any type of current measurement is possible for this purpose in principle, whether by an induced magnetic field (e.g., Rogowski coil, Hall sensor) or by current measurement using a shunt resistor R or the like.

The switch SW is capable of interrupting a current flow through the device 1. In principle, any type of switch can be used here, for example a mechanical switch or an electrical switch, such as a controlled (field-effect) transistor.

Furthermore, the device uses a voltmeter $U_{SW}$, which measures a voltage via the switch SW. Since the switch SW represents a short circuit in the idealized case, it is sufficient to measure voltages in the opened state of the switch SW, since the voltage should be zero when the switch SW is closed.

Depending on the type of switch SW, however, a provision can also be made that the switch SW itself represents a low resistance, for example, so that the current measurement could use the closed switch as a shunt resistor R, for example. Such a case can occur, for example, when using semiconductor switches (e.g., controlled (field-effect) transistors).

The previously described division must therefore be understood as being functional and not limiting the actual implementation.

If the current meter measures a current I in step S100 that exceeds a first threshold $I_{ref,1}$ (step S150), the first counter $Z_I$ is changed in step S200 by a first increment $INC_1$ in a first direction and the switch is actuated in step S300 such that the current flow is interrupted.

Obviously, several current thresholds according to FIG. 2 can also be provided. The actual comparison with two or more thresholds can also be implemented in one processing step.

After a change in the counter, the first counter $Z_1$ is compared with a first counter threshold $Z_{I,MAX}$ in step S400, and if the first counter threshold $Z_{I,MAX}$ has been reached or exceeded, the switch is actuated continuously such that the current flow is interrupted, and the process terminates.

Otherwise, the second counter $Z_U$ is changed in step S700 by a second increment $INC_2$ in a third direction +. The second increment $INC_2$ can correspond, for example, to the voltage measured by the voltmeter.

A provision can also be made for this purpose that the voltage at the switch $U_{SW}$ is compared with the actual source voltage $U_N$ on the network side. In this way, any fluctuations in the voltage on the network can be better taken into account.

Again, the second increment $INC_2$ can also be dependent on the magnitude of the deviation. For example, if a comparison reveals that 95% of the (expected or measured) source voltage $U_N$ is being exceeded, the second counter $Z_U$ could be incremented by a first value (e.g., 100), whereas in the event that 95% of the (expected or measured) source voltage $U_N$ is being undershot, the second counter $Z_U$ is incremented by a second value (e.g., 10).

Obviously, several current thresholds can also be provided. The actual comparison with two or more thresholds can also be implemented in one processing step.

After a change in the counter, the second counter $Z_U$ is compared with a second counter threshold $Z_{U,MAX}$ in a subsequent step S800, and if the second counter threshold $Z_{U,MAX}$ has been reached or exceeded, the switch SW is actuated continuously such that the current flow is interrupted, and the process terminates.

Otherwise, waiting is performed in step S900, and the process returns to step 50.

In another advantageous embodiment of the invention, if the current meter, subsequently to a temporary interruption of the current flow, measures a current in step 100 that does not exceed the first current threshold $I_{ref,1}$, the first counter $Z_I$ is changed by a third increment $INC_3$ in a second direction in step S1000. The second direction is different from the first direction. Moreover, in step S1100, the second counter $Z_U$ is changed by a fourth increment $INC_4$ in a fourth direction, with the fourth direction being different from the third direction.

Depending on the type of counter, a check in steps S950 and S1050 can precede the two "return" operations S1000 and S1100, for example in order to avoid a counter overflow or the like.

In another advantageous embodiment of the invention, the device 1 further comprises setting means for the counter that sets the first counter $Z_I$ to a predetermined counter value at the beginning of operation in step S25. For example, the first counter $Z_I$ and the second counter $Z_U$ can each be set to 0.

The individual steps can also be readily grouped in another sensible manner or integrated into a sub-step or divided into several sub-steps. The steps described are therefore exemplary. The aspects discussed in relation to FIGS. 2 and 3 can also be used in the respective other embodiment.

The abovementioned steps and means can be components of a control unit SE or be executed by same. A control unit can be a microcontroller or an ASIC or an FPGA, for example.

LIST OF REFERENCE SYMBOLS

Device 1
Current meter $U_R$
Voltmeter $U_{SW}$
Switch SW
First/second current threshold $I_{ref,2}$, $I_{ref,1}$
First/second counter $Z_I$, $Z_U$
First/second counter threshold $Z_{I,MAX}$, $Z_{U,MAX}$
Predetermined time $t_{off}$
Threshold $U_{ref}$
Current I
Shunt resistor R
Computing unit SE
Load V
First/second/third/fourth increment $INC_1$, $INC_2$, $INC_3$, $INC_4$

The invention claimed is:

1. A device for detecting an overcurrent, having a current meter, a first counter, and a switch,
wherein the current meter measures a current through the device, with the switch being capable of interrupting a current flow through the device,
wherein, if the current meter measures a current that exceeds a first current threshold, the first counter is changed by a first increment in a first direction,
wherein, if the current meter measures a current that exceeds a second current threshold, the first counter is changed by a second increment in the first direction, with the second current threshold being quantitatively greater than the first current threshold, and with the second increment being quantitatively greater than the first increment, wherein, after a change in the counter, the first counter is compared with a first counter threshold, and if the counter threshold has been reached or exceeded, the switch is actuated continuously such that the current flow is interrupted, and otherwise the switch (SW) is actuated for a predetermined time such that the current flow is interrupted.

2. The device as set forth in claim 1, wherein, if the current meter, subsequently to a temporary interruption of the current flow, measures a current (I) that does not exceed the first current threshold, the first counter is changed by a third increment in a second direction, with the second direction being different from the first direction.

3. The device as set forth in claim 1, further comprising a setting means for the counter which sets the first counter to a predetermined counter value at the beginning of operation.

4. A device for detecting an overcurrent, having
a current meter, a first counter, a second counter, a voltmeter, and a switch,
wherein the current meter measures a current through the device, with the switch being capable of interrupting a current flow through the device and with the voltmeter measuring a voltage via the switch,
wherein, if the current meter measures a current that exceeds a first threshold, the first counter is changed by a first increment in a first direction and the switch is actuated such that the current flow is interrupted,
wherein, after a change in the counter, the first counter is compared with a first counter threshold, and if the first counter threshold has been reached or exceeded, the switch is actuated continuously such that the current flow is interrupted, and otherwise the second counter is changed by a second increment in a third direction that corresponds to the voltage measured by the voltmeter,
wherein, after a change in the counter, the second counter is compared with a second counter threshold, and if the second counter threshold has been reached or exceeded, the switch is continuously actuated such that the current flow is interrupted, and otherwise the switch, after a predetermined time, is actuated such that the current flow is no longer interrupted.

5. The device as set forth in claim 4, wherein, subsequently to a temporary interruption of the current flow, if the current meter measures a current that does not exceed the first threshold, the first counter is changed by a third increment in a second direction, wherein the second direction is different from the first direction, and wherein the second counter is changed by a fourth increment in a fourth direction, with the fourth direction being different from the third direction.

6. The device as set forth in claim 4, further comprising a setting means for the first counter which sets the first counter to a predetermined counter value at the beginning of operation.

7. The device as set forth in claim 4, further comprising a setting means for the second counter which sets the second counter to a predetermined counter value at the beginning of operation.

8. A device for detecting an overcurrent, having
a current meter, a first counter, a switch, and a setting means for the counter which sets the first counter to a predetermined counter value at a beginning of operation wherein the current meter measures a current through the device, with the switch being capable of interrupting a current flow through the device,
wherein, if the current meter measures a current that exceeds a first current threshold, the first counter is changed by a first increment in a first direction,
wherein, if the current meter measures a current that exceeds a second current threshold, the first counter is changed by a second increment in the first direction, with the second current threshold being quantitatively greater than the first current threshold, and with the second increment being quantitatively greater than the first increment,
wherein, after a change in the counter, the first counter is compared with a first counter threshold, and if the counter threshold has been reached or exceeded, the switch is actuated continuously such that the current flow is interrupted, and otherwise the switch (SW) is actuated for a predetermined time such that the current flow is interrupted, wherein, if the current meter, subsequently to a temporary interruption of the current flow, measures a current (I) that does not exceed the first current threshold, the first counter is changed by a third increment in a second direction, with the second direction being different from the first direction.

* * * * *